United States Patent [19]

Trox et al.

[11] Patent Number: 4,870,364

[45] Date of Patent: Sep. 26, 1989

[54] METHOD OF, AND APPARATUS FOR, MONITORING THE OPERATION OF ELECTROMAGNETIC HYDRAULIC VALVES

[75] Inventors: Uwe Trox, Ottmarsbocholt; Willy Kussel, Werne; Martin Reuter; Johannes König, both of Munich, all of Fed. Rep. of Germany

[73] Assignee: Gewerkschaft Eisenhutte Westfalia GmbH, Fed. Rep. of Germany

[21] Appl. No.: 191,585

[22] Filed: May 9, 1988

[30] Foreign Application Priority Data

May 9, 1987 [DE] Fed. Rep. of Germany ....... 3715591

[51] Int. Cl.[4] .......................................... G01R 31/00
[52] U.S. Cl. .................................. 324/418; 324/546; 340/644
[58] Field of Search ............... 324/415, 418, 420, 422, 324/423, 546, 547; 340/644, 686; 137/554

[56] References Cited

U.S. PATENT DOCUMENTS

| 3,988,664 | 10/1976 | Beery et al. | 324/423 |
| 4,692,939 | 9/1987 | Parsons | 324/423 X |
| 4,712,071 | 12/1987 | Charbonneau et al. | 324/415 |
| 4,746,869 | 5/1988 | Schrag et al. | 324/546 |
| 4,764,729 | 8/1988 | Yakuwa et al. | 324/418 X |

Primary Examiner—Reinhard J. Eisenzopf
Assistant Examiner—Jack B. Harvey
Attorney, Agent, or Firm—Samuels, Gauthier, Stevens & Kehoe

[57] ABSTRACT

The operation of an electromagnetic valve is monitored by connecting the coil of the valve to a d.c. source for a period of time sufficient to permit the current in the coil to reach its maximum steady state value then disconnecting the coil to permit the current to fall and re-connecting the coil to the source again and measuring the current which is established in the coil.

9 Claims, 3 Drawing Sheets

METHOD OF, AND APPARATUS FOR, MONITORING THE OPERATION OF ELECTROMAGNETIC HYDRAULIC VALVES

FIELD OF THE INVENTION present invention relates in general to electromagnetically-operated hydraulic valves as used in mineral mining installations and more particularly to a method of, and apparatus for, monitoring the operation of such valves.

BACKGROUND TO THE INVENTION

In mineral, e.g. coal, mining installations in underground mine workings, it is well known to provide each roof support with a control unit forming part of an electro-hydraulic control system for the installation. This control unit, which normally has a microprocessor, serves to energize a large number of electromagnetic valves which function to control the flow of hydraulic pressure fluid to various devices. In the harsh environment in the working, the valves are prone to fail from time to time and this can have serious consequences. There is a need to detect the failure of a valve as soon as possible so that it can be replaced. In one known monitoring apparatus described in German patent specification No.2923694 luminous diodes are provided in the energizing circuits of the coils of the valves. This provides a reliable indication of whether the coil of a valve is open circuit but this is only one fault condition which can occur. This simple technique does not provide any indication as to whether the spools or armatures of the valves are being displaced correctly or whether a valve has become jammed in one switching state. German patent Specification No. 2602906 describes monitoring apparatus in which a signal is generated when the armature of a valve reaches its switching positions. If the signal occurs outside a certain allowable time period then a fault condition prevails. This monitoring technique thus relies essentially on the response time of the armature and detects when the current through the coil drops.

A general object of the present invention is to provide an improved monitoring method and apparatus.

SUMMARY OF THE INVENTION

In accordance with the invention the coil of an electromagnetic valve to be monitored is initially subjected to an energizing d.c. current until the current reaches a maximum steady state level. During this phase, the current should rise, then fall back as the armature displaces and then rise again to the maximum level. The source of d.c. current is then disconnected to permit the current to decay to a lower level and then re-connected so that the decaying current rises again. At the instant when the source is re-connected or at some later time before the current assumes its maximum level again the current is measured and a comparison of the measured current with a pre-determined reference indicates the state of the valve. The invention can also be realized by establishing a pre-determined current reference say zero, to ascertaining the maximum current level and extrapolating the time constant of the current change.

The aforementioned control unit with a microprocessor can easily be adapted to perform the monitoring operations and the first fall in the current signifying the armature has responded can be detected as an indication that the valve has operated. This of itself is convenient as a control parameter and the control unit controlling a number of valves may use this revertive signal to confirm that a valve has operated. A number of valves can be subjected to the monitoring operation.

The invention can be realized without necessitating any means on the valve or valves and indeed since the control unit usually employs a microprocessor this can be used to provide the necessary apparatus. In accordance with the invention monitoring apparatus comprises a d.c. source for energizing a coil of the valve to be monitored, switch means for connecting and disconnecting the coil to the source in response to timed control signals means for measuring the current in the coil and means for evaluating the measured current; whereby the coil is connected to the source until the current in the coil reaches a predetermined level, the coil is disconnected until the current decays to a lower level the source is re-connected to the coil and the current in the coil is measured to ascertain whether the current is at a first or second value representing one of the operating states of the valve.

In general, the inductivity of the coil of an electromagnetic valve depends on the armature position which causes the rise or decay of current on making or breaking of the DC circuit, to take a different course according to the direction of movement of the armature. The slope or inclination of the current/time curves differs according to the construction of the valve but in any case the time constant of the current and thus the switching state of the valve can be determined by ascertaining the course taken by the current/time curve. The monitoring can also be effected at any desired or predetermined moment regardless of the operationally required switching of the valves. With intrinsically safe valves, such as are used above all in electro-hydraulic control systems in mining, it is advisable for the monitoring and current measurement to take place on the low voltage side of a rectifier bridge to preserve the intrinsic safety. When a number of valves are provided which can also be switched on at the same time and are connected up to one common current supply system, it is advisable to effect the monitoring in such a way that the switching state of the relevant valve is determined from the measured current values and a preselected current reference value as well as from the maximum switch on current, via the time constant of the current-/time curve of the coil. In this case, therefore, the current reference value which forms the zero point for the operation of the relevant valve and also the full switch-on current are determined in addition. In determining the current reference value account is taken of the fact that under certain circumstances still further valves are switched on of which the currents in each case have to be subtracted in effecting the monitoring operation. One single current measuring point is thus sufficient.

The invention can be adopted with particular advantage in the case of self-locking electromagnetic valves, as these have sufficient inertia where their armature adjustment is concerned, so that the armature of the valve being measured remains at rest provided the period between switching off and again switching on the current flowing through the coil is made sufficiently short.

As already mentioned, the invention can be easily adapted by modifying the control units of an electro-hydraulic control system. A number of electromagnetic valves can then be actuated individually or in sets and monitored. The electronic control unit can in this case be provided with an optical and/or acoustic display in order to indicate any failure of the valves. For preference, the apparatus according to the invention or an evaluation unit formed in the control unit is so constructed that in the event of an operating fault of a valve one or more repetitions of the operation are set up. It has been found that, if the armature fails to move as required, then a repetition of the cycle of operations i.e. fresh supply of current to the coil, often causes the switching operation to be effected. Thus if the electrical activation of a valve does not cause a response, the actuation process or command is repeated, which, in many cases, as already stated, leads to the desired switching operation.

The invention may be understood more readily and various other aspects and features of the invention may become apparent from consideration of the following description.

BRIEF DESCRIPTION OF DRAWINGS

An embodiment of the invention will now be described by way of example only, with reference to the accompanying drawings wherein.

DESCRIPTION OF PREFERRED EMBODIMENT

Figure 1:
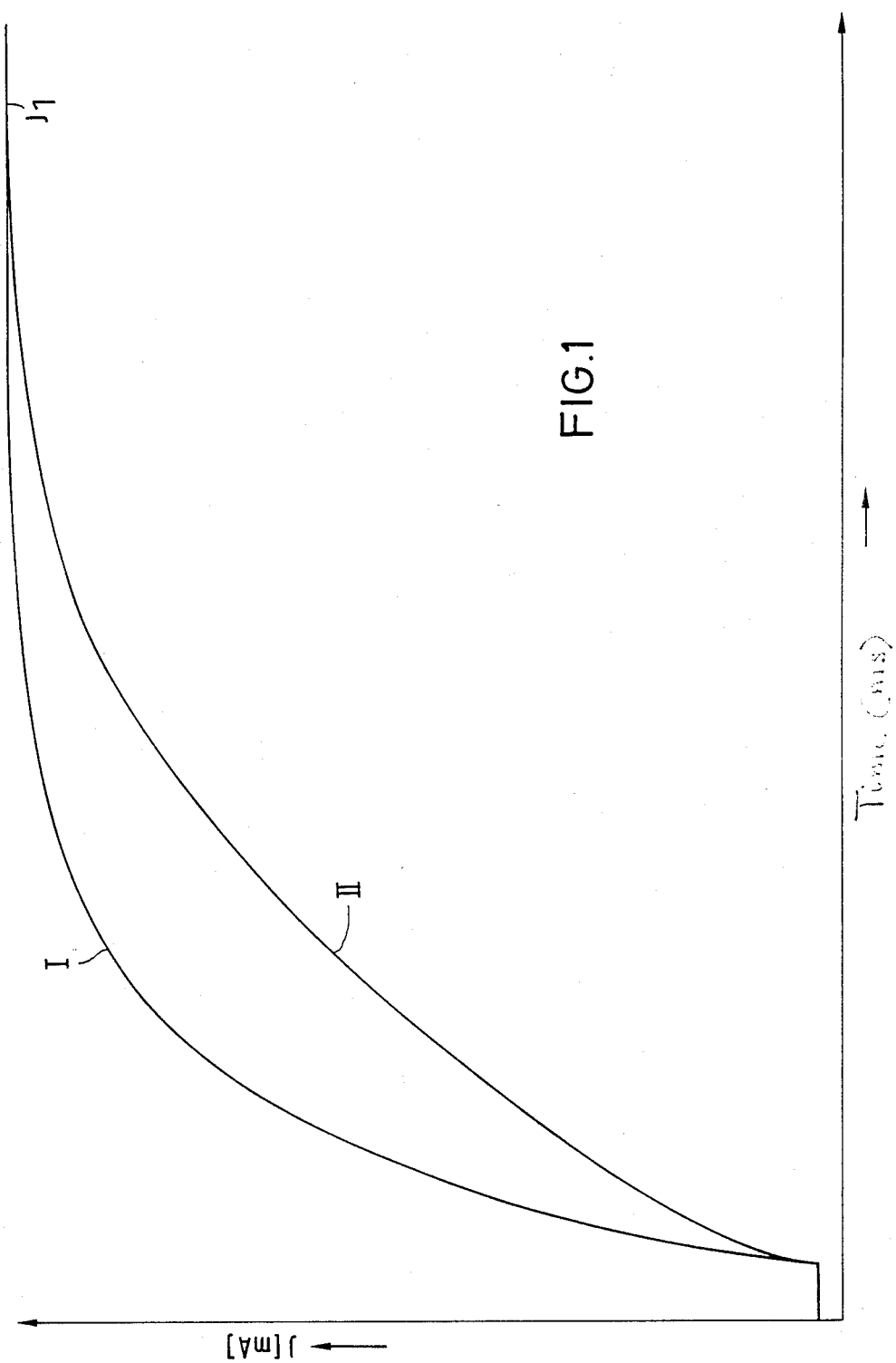
FIG. 1 is a graphical representation of the electrical current in a coil of an electromagnetic solenoid actuator as a function of time for different movements of its armature.
Figure 2:
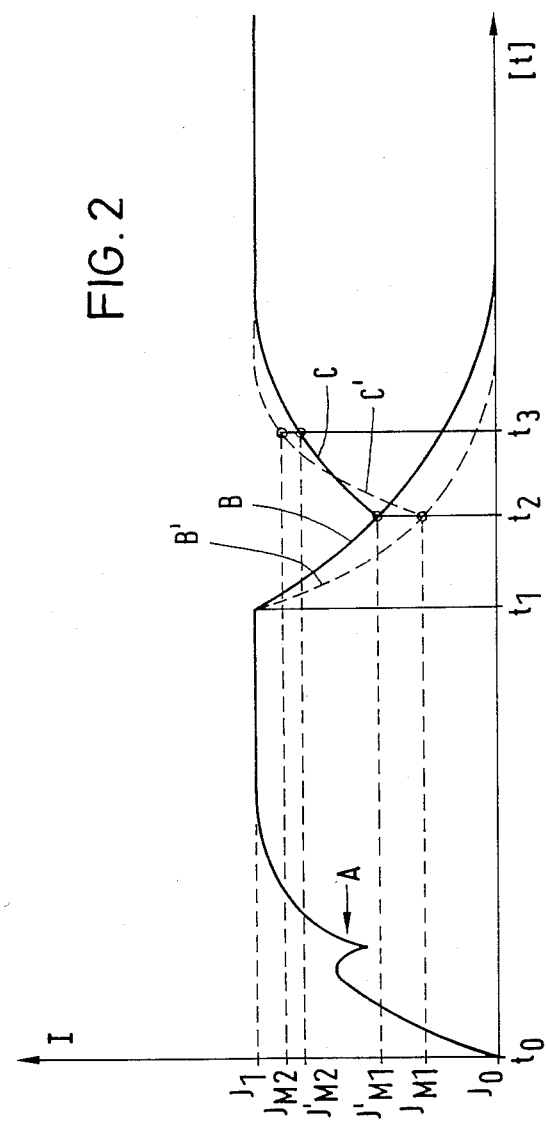
FIG. 2 is a graphical representation of the current through the coil as a function of time which assists in explaining the principle of the invention.

In FIGS. 1 and 2, the abscissa represents time in milliseconds and the ordinate the intensity of current in milliamps. When the coil of an electromagnetic actuator or solenoid is connected to a d.c. source the current increases in an exponential manner as is known in accordance with the inductance of the coil. The inductance is however influenced by the position and direction of displacement of the spool or armature which is displaced by the electromagnetic field created by the coil. Thus curves I and II shows the condition when the armature adopts different positions. The maximum current $I_1$ is the same in both cases. When the d.c. source is disconnected from the coil the current decays in an exponential manner and exhibits a similar differential dependent on the position of the armature.

In practice, electromagnetic valves of various designs as employed in mineral mining installations all employ at least one coil and an armature or spool and hence the characteristics of FIG. 1 apply to such valves with only the inclination of the curves being different. When the armature or spool is displaced by electromagnetic force the current through the coil undergoes a characteristic change because the inductance alters. The invention is based upon monitoring the operation of an electromagnetic valve by sensing these current changes. FIG. 2 shows the current in the coil when the coil of a valve is initially energized at moment $t_O$. The current increases progressively but then undergoes a fall and then another rise on a different inclination with a characteristic 'kink' A due to the displacement of the armature. The current then continues to rise to reach its maximum level $J_1$ at time $t_1$. For performance of the monitoring method of the invention at time $t_1$ the energization of the coil ceases and the source current is zero $J_O$. The current in the coil however is still finite and decays as indicated by curve portion B. The curve portion B' represents the current in the case where the armature was displaced in an opposite case to the case of curve portion B. At time $t_2$ the current supply is established again and the current in the coil rises to $J'M_1$ or $JM_1$ in the case of curve portion B'. The current differential between $J'M_1$ and $JM_1$ represents the position of the armature and the switching state of the valve and hence by measuring or monitoring the coil current the switching state of the valve can be ascertained. The current rise curve portion C or C' at a subsequent time $t_3$ can also be used to determine the switching state of the valve by ascertaining the current differential between $J'M_2$ and $JM_2$. In general, after the source current is switched off at time $t_1$ and then re-established at time $t_2$ one or more measurements of current can be taken to determine the valve state. It is not essential for the source current to fall to zero ($J_O$) and where a number of valves are monitored and these are driven from a common d.c. source the current $J_O$ may form a reference value at some other non-zero value. It is also possible to measure the current value $J_O$ and $J_1$ for a number of valves. The monitoring apparatus can be assembled with control units connected to the valves via cables and no modification is needed on the valves themselves.

If the valves are not of the self-locking type and the armatures have sufficient inertia the interval which elapses between the times $t_1$ and $t_2$ can be sufficiently short to permit the armature to remain at rest during the monitoring operation.

Figure 3:
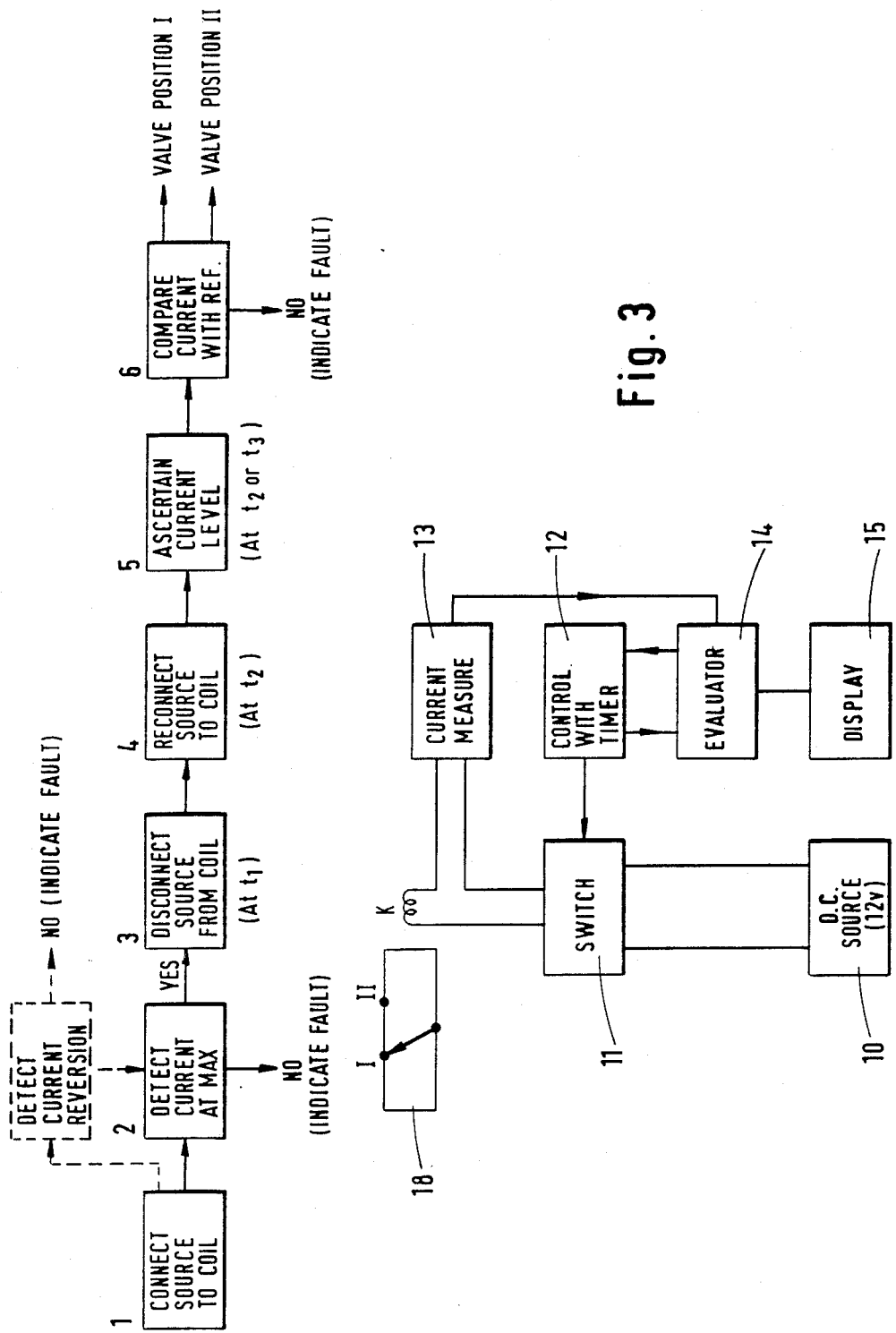
FIG. 3 is a block schematic diagram showing the components and process steps of monitoring apparatus in accordance with the invention.

The invention can be realized in various ways and FIG. 3 depicts the preferred steps involved in performing the monitoring operation in accordance with FIG. 2 and the equivalent necessary components of one form of monitoring apparatus. The apparatus can be embodied in the electronic circuitry of a control unit used to control the operation of a bank of valves. As shown, a valve 18 to be monitored has two switched positions I & II and its coil K is energized by a d.c. source 10. The source 10 is connected to the coil K under control of a switch unit 11 subjected to control signals from control unit 12 incorporating a timer. The coil current is measured by a unit 13 and is assessed by an evaluator 14 which stores inter alia current values. The unit 13 can also detect the reverse in the rising current signifying the response of the armature. A fault condition can be indicated by a display 15.

We claim:

1. A method of monitoring the operating state of an electromagnetic valve having a displaceable spool moved between first and second operating positions by energizing a coil; said method comprising the steps of connecting the coil of the valve to be monitored to an electrical d.c. source until the current in the coil rises from an initial reference value to reach a pre-determined maximum value, disconnecting the source from the coil for a pre-determined time sufficient to allow the current to decay to an intermediate value greater than the reference value but lower than the maximum value, re-connecting the source to the coil, measuring the current in the coil and determining from the measured value, the reference value and the maximum value whether the current is at a first or a second value representing the first or the second operating positions of the spool.

2. A method according to claim 1, wherein the current is measured when the source is re-connected to the coil.

3. A method according to claim 1, wherein the current is measured at some time after the source is re-connected to the coil but prior to the re-establishment of the maximum level.

4. A method according to claim 1, and further comprising detecting when the initial current increase reverses to signify the movement of an armature of the value.

5. A method according to claim 1 wherein the time interval between the disconnection and the re-connection is sufficiently short to ensure the spool of the valve remains in the positions previously adopted.

6. Apparatus for monitoring the operating state of an electromagnetic valve having a displaceable spool moved between first and second operating positions by energizing a coil; said apparatus comprising a d.c. source for energizing the coil of the valve to be monitored; switch means for connecting and disconnecting the coil to the source in response to timed control signals to cause the source to be connected to the coil, to cause the current in the coil to rise from an initial reference value to reach a pre-determined maximum value, to cause the source to be disconnected from the coil to permit the current to decay to an intermediate value greater than the reference value but lower than the maximum value, and to cause the source to be re-connected to the coil; means for measuring the current in the coil after re-connection of the source and means for evaluating from the measured current value, the reference value and the maximum value whether the measured current is at a first or second value representing the first or the second operating position of the spool.

7. Apparatus according to claim 6 and embodied in a control unit for actuating the valve.

8. Apparatus according to claim 6 and further comprising a display for indicating the state of the valve.

9. A method of monitoring the operation state of an electromagnetic valve having a displaceable spool moved between first and second operating positions by energizing a coil to ascertain whether the spool has responded to energization of the coil or has jammed; said method comprising the steps of connecting the coil of the value to be monitored to an electrical d.c. source to energize the coil until the current in the coil rises from an initial reference value to reach a pre-determined maximum value, disconnecting the source from the coil for a pre-determined time sufficient to allow the current to decay to an intermediate value greater than the reference value but lower than the maximum value, re-connecting the source to the coil, measuring the current in the coil at or shortly after the re-connection, determining from the measured value, the reference value, and the maximum value, whether the measured current is at a first or a second value signifying a time constant representing the first or the second operating positions of the spool and ascertaining whether or not the spool has changed its position in response to the energization of the coil.

* * * * *